US010703970B2

(12) United States Patent
Umehara et al.

(10) Patent No.: US 10,703,970 B2
(45) Date of Patent: Jul. 7, 2020

(54) COLOR CONVERSION COMPOSITION, COLOR CONVERSION FILM AND LIGHT EMITTING DEVICE INCLUDING THE SAME, LIQUID CRYSTAL DISPLAY DEVICE, AND ILLUMINATION DEVICE

(71) Applicants: TORAY INDUSTRIES, INC., Tokyo (JP); Toray Chemical Korea Incorporated, Gumi-si, Gyeongsangbuk-do (KR)

(72) Inventors: Masaaki Umehara, Otsu (JP); Jinwoo Kwon, Seoul (KR); Hyo-seok Kim, Seoul (KR)

(73) Assignees: Toray Industries, Inc., Tokyo (JP); Toray Chemical Korea Incorporated, Gumi-si, Gyeongsangbuk-do (KR)

( * ) Notice: Subject to any disclaimer, the term of this patent is extended or adjusted under 35 U.S.C. 154(b) by 384 days.

(21) Appl. No.: 15/738,433

(22) PCT Filed: Jun. 23, 2016

(86) PCT No.: PCT/JP2016/068708
§ 371 (c)(1),
(2) Date: Dec. 20, 2017

(87) PCT Pub. No.: WO2017/002707
PCT Pub. Date: Jan. 5, 2017

(65) Prior Publication Data
US 2018/0179439 A1 Jun. 28, 2018

(30) Foreign Application Priority Data
Jun. 29, 2015 (JP) .................. 2015-130335

(51) Int. Cl.
| *C09K 11/06* | (2006.01) |
| *G02B 5/20* | (2006.01) |
| *F21V 9/30* | (2018.01) |
| *C07F 5/02* | (2006.01) |
| *C09K 11/02* | (2006.01) |
| *H01L 27/32* | (2006.01) |
| *F21Y 115/10* | (2016.01) |
| *G02F 1/13357* | (2006.01) |

(52) U.S. Cl.
CPC .............. *C09K 11/06* (2013.01); *C07F 5/022* (2013.01); *C09K 11/02* (2013.01); *F21V 9/30* (2018.02); *G02B 5/20* (2013.01); *C09K 2211/1007* (2013.01); *C09K 2211/1018* (2013.01); *F21Y 2115/10* (2016.08); *G02F 1/1336* (2013.01); *G02F 2001/133614* (2013.01); *H01L 27/322* (2013.01)

(58) Field of Classification Search
CPC .......... H01L 27/322; F21V 9/30; C07F 5/022; F21Y 2115/10; C09K 11/06; C09K 11/02; C09K 2211/1022
See application file for complete search history.

(56) References Cited

U.S. PATENT DOCUMENTS

2010/0264406 A1* 10/2010 Nagao .................. C07D 207/44
257/40
2012/0264406 A1 10/2012 Mohler
2017/0349822 A1 12/2017 Lee et al.

FOREIGN PATENT DOCUMENTS

| CN | 101835873 A | 9/2010 |
| JP | 2001164245 A | 6/2001 |
| JP | 2002317175 A | 10/2002 |
| JP | 2002348568 A | 12/2002 |
| JP | 2007273440 A | 10/2007 |
| JP | 2010061824 A | 3/2010 |
| JP | 2011-241160 | * 12/2011 |
| JP | 2011241160 A | 12/2011 |
| JP | 2012022028 A | 2/2012 |

(Continued)

OTHER PUBLICATIONS

Chinese Office Action for Chinese Application No. 201680036298. 9, dated Apr. 15, 2019, with translation, 18 pages.

(Continued)

Primary Examiner — C Melissa Koslow
(74) Attorney, Agent, or Firm — RatnerPrestia

(57) ABSTRACT

A color conversion composition that converts incident light into light having a wavelength longer than that of the incident light includes:
a compound represented by Formula (1):

$$\begin{array}{c}\text{Ar}^4 \quad \text{Ar}^5 \quad \text{Ar}^1 \\ \text{R}^2 \underset{\text{Ar}^3}{\overset{}{\diagdown}} \text{N} \underset{\text{R}^4 \; \text{R}^3}{\overset{\text{B}}{\diagdown}} \text{N} \underset{\text{Ar}^2}{\overset{}{\diagup}} \text{R}^1\end{array} \quad (1)$$

($R^1$ to $R^4$ are the same or different from each other and selected from the group consisting of hydrogen, an alkyl group, a cycloalkyl group, an aralkyl group, an alkenyl group, a cycloalkenyl group, an alkynyl group, a hydroxy group, a mercapto group, an alkoxy group, an alkylthio group, an aryl ether group, an aryl thioether group, an aryl group, a heteroaryl group, a heterocyclic group, a halogen, a haloalkane, a haloalkene, a haloalkyne, a cyano group, an aldehyde group, a carbonyl group, a carboxy group, an ester group, a carbamoyl group, an amino group, a nitro group, a silyl group, a siloxanyl group, and a ring structure formed between adjacent substituents; $Ar^1$ to $Ar^4$ are aryl groups and $Ar^1 \neq Ar^2$ or $Ar^3 \neq Ar^4$, and $Ar^5$ is an aryl group or a heteroaryl group); and
a binder resin.

11 Claims, 3 Drawing Sheets

(56) References Cited

FOREIGN PATENT DOCUMENTS

JP   2014136771 A   7/2014
KR    101590299 B1   2/2016
WO   2009057567 A1   5/2009

OTHER PUBLICATIONS

International Search Report and Written Opinion for International Application No. PCT/JP2016/068708, dated Aug. 9, 2016—6 Pages.
Jichao et al., "An Efficient Synthesis of Heptaaryldipyrromethenes from Tetraarylcyclopentadienones and Ammonium Acetate and Their Extension to the Corresponding BODIPYs", Organic and Biomolecular Chemistry, 2012, vol. 10, pp. 8848-8859.
Chinese Office Action for Chinese Application No. 201680036298.9, dated Oct. 28, 2019 with translation, 23 pages.

* cited by examiner

COLOR CONVERSION COMPOSITION, COLOR CONVERSION FILM AND LIGHT EMITTING DEVICE INCLUDING THE SAME, LIQUID CRYSTAL DISPLAY DEVICE, AND ILLUMINATION DEVICE

CROSS REFERENCE TO RELATED APPLICATIONS

This is the U.S. National Phase application of PCT/JP2016/068708, filed Jun. 23, 2016, which claims priority to Japanese Patent Application No. 2015-130335, filed Jun. 29, 2015, the disclosure of each of these applications being incorporated herein by reference in its entirety for all purposes.

TECHNICAL FIELD OF THE INVENTION

The present invention relates to a color conversion composition, a color conversion film, and a light emitting device including the same, a liquid crystal display device, and a lighting device.

BACKGROUND OF THE INVENTION

Applications of multicolor technology based on color conversion methods to liquid crystal displays, organic EL displays, lighting, and the like have been actively studied. The color conversion means that light emitted from a light emitter is converted into light having a longer wavelength, and, for example, refers to converting blue light emission into green light emission or red light emission. By forming this composition having a color conversion function into a film and combining the film with, for example, a blue light source, three primary colors of blue, green, and red can be extracted from the blue light source, that is, white light can be extracted. A white light source formed by combining such a blue light source and a film having the color converting function is used as a backlight unit and this backlight unit, a liquid crystal driving portion, and a color filter are combined, whereby a full color display can be produced. In addition, when no liquid crystal driving part is included, the backlight unit can be used as it is as a white light source and can be applied as a white light source such as LED illumination.

Examples of a problem of the liquid crystal display include improvement of color reproducibility. In order to improve the color reproducibility, increase in color purity of each color of blue, green, and red by narrowing half width of each light emission spectrum of blue, green, and red of the backlight unit is effective. As a means for solving this problem, a technique of using quantum dots of inorganic semiconductor fine particles as a component of a color conversion composition has been proposed (refer to Patent Literature 1, for example). In the technique of using these quantum dots, the half widths of the light emission spectra of green and red are certainly narrow and the color reproducibility is improved. On the other hand, the quantum dots are weak against heat, and moisture and oxygen in the air and thus durability has been insufficient.

In addition, a technique of using an organic light emitting material as a component of a color conversion composition instead of the quantum dots has also been developed. Disclosed examples of the techniques using the organic light emitting material as the component of the color conversion composition include a technique using a pyridine-phthalimide condensation derivative (refer to Patent Literature 2, for example), a technique using a coumarin compound (refer to Patent Literature 3, for example), a technique using a perylene derivative as a red light emitting material (refer to Patent Literature 4, for example), a technique using a rhodamine-based compound (refer to Patent Literature 5, for example), and a technique using a pyrromethene compound (refer to Patent Literatures 6 and 7, for example).

CITATION LIST

Patent Literature

Patent Literature 1: Japanese Laid-open Patent Publication No. 2012-22028
Patent Literature 2: Japanese Laid-open Patent Publication No. 2002-348568
Patent Literature 3: Japanese Laid-open Patent Publication No. 2007-273440
Patent Literature 4: Japanese Laid-open Patent Publication No. 2002-317175
Patent Literature 5: Japanese Laid-open Patent Publication No. 2001-164245
Patent Literature 6: Japanese Laid-open Patent Publication No. 2011-241160
Patent Literature 7: Japanese Laid-open Patent Publication No. 2014-136771

SUMMARY OF THE INVENTION

Even the above-described conventional organic light emitting material is used, however, the performance has been still insufficient from the viewpoint of achieving both color reproducibility and durability at the same time. In particular, the technique of using, an organic light emitting material having red light emission of high color purity and satisfying durability as a component of the color conversion composition has been insufficient.

The present invention has been made in view of the above problems and an object of the present invention is to achieve both color reproducibility improvement and durability at the same time, in particular, to achieve both red light emission of high color purity and durability at the same time in the color conversion composition used for a liquid crystal display, LED illumination, and the like.

To solve the above-described problem and achieve the object, a color conversion composition according to the present invention converts incident light into light having a wavelength longer than that of the incident light, and includes a compound represented by Formula (1); and a binder resin.

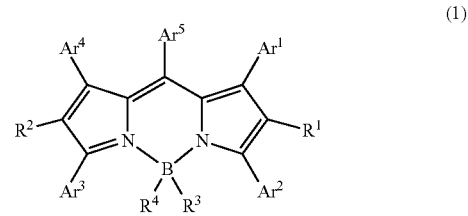

(1)

($R^1$ to $R^4$ are the same or different from each other and selected from the group consisting of hydrogen, an alkyl group, a cycloalkyl group, an aralkyl group, an alkenyl group, a cycloalkenyl group, an alkynyl group, a hydroxy group, a mercapto group, an alkoxy group, an alkylthio group, an aryl ether group, an aryl thioether group, an aryl group, a heteroaryl group, a heterocyclic group, a halogen, a haloalkane, a haloalkene, a haloalkyne, a cyano group, an aldehyde group, a carbonyl group, a carboxy group, an ester group, a carbamoyl group, an amino group, a nitro group, a silyl group, a siloxanyl group, and a ring structure formed between adjacent substituents; $Ar^1$ to $Ar^4$ are the same or different from each other and are groups represented by Formula (2). $R^5$ is selected from the group consisting of an alkyl group, a cycloalkyl group, an alkoxy group, and an alkylthio group; m is an integer of 1 to 3; when m is 2 or more, each $R^5$ is the same as or different from each other; with the proviso that $Ar^1 \neq Ar^2$ or $Ar^3 \neq Ar^4$ and at least one of $Ar^1$ to $Ar^4$ is a group in which $R^5$ is an alkyl group having 4 or more carbon atoms; (here, "$\neq$" refers to groups having different structures); and $Ar^5$ is an aryl group or a heteroaryl group).

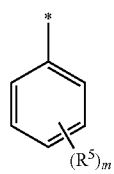

(2)

Moreover, in the above-described color conversion composition according to the present invention, at least one of $Ar^1$ to $Ar^4$ in the compound represented by Formula (1) is a group represented by Formula (2) in which $R^5$ is an alkoxy group.

Moreover, in the above-described color conversion composition according to the present invention, both $R^3$ and $R^4$ in the compound represented by Formula (1) are fluorine.

Moreover, in the above-described color conversion composition according to the present invention, the compound represented by Formula (1) has a local maximum light emission in a region of 580 nm to 750 nm.

Moreover, the above-described color conversion composition according to the present invention further includes a compound having a local maximum light emission in a region of 500 nm to 580 nm.

Moreover, a color conversion film according to the present invention includes a layer obtained by curing the color conversion composition according to any one of the above-described inventions.

Moreover, a light emitting device according to the present invention includes a light source and the color conversion film according to the above-described invention.

moreover, in the above-described light emitting device according to the present invention, the light source has a maximum light emission peak in a region of 400 nm to 500 nm.

moreover, in the above-described light emitting device according to the present invention, the light source is a light emitting diode.

Moreover, a liquid crystal display device according to the present invention includes the light emitting device according to any one the above-described inventions.

Moreover, a lighting device according to the present invention includes the light emitting device according to any one the above-described inventions.

The present invention can achieve an advantageous effect of providing a color conversion composition that can achieve both improvement in color reproducibility and high durability at the same time, in particular, can achieve both high color purity of red and high durability at the same time, a color conversion film using the color conversion composition and a light emitting device including the color conversion film, a liquid crystal display device, and a lighting device.

DETAILED DESCRIPTION OF CERTAIN EMBODIMENTS OF THE INVENTION

Figure 1:
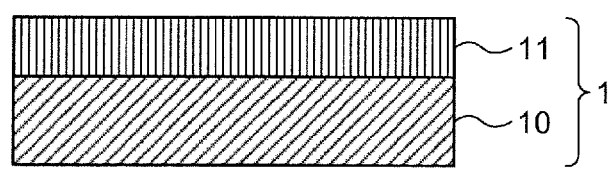
FIG. 1 is a schematic sectional view illustrating one example of a color conversion film according to the embodiment of the present invention.

Hereinafter, embodiments of the present invention will be specifically described. The present invention, however, is not limited to the following embodiments and various modifications can be made depending on purposes and applications.

<Compound Represented by Formula (1)>

The color conversion composition according to an embodiment of the present invention is a color conversion composition that converts incident light from a light source into light having a wavelength longer than that of the incident light and includes a compound represented by Formula (1).

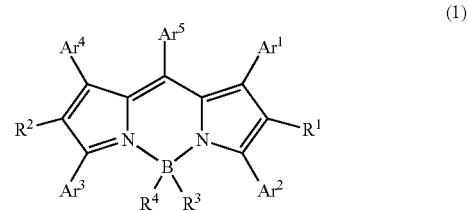

(1)

In Formula (1), $R^1$ to $R^4$ may be the same or different from each other and are selected from the group consisting of hydrogen, an alkyl group, a cycloalkyl group, an aralkyl group, an alkenyl group, a cycloalkenyl group, an alkynyl group, a hydroxy group, a mercapto group, an alkoxy group, an alkylthio group, an aryl ether group, an aryl thioether group, an aryl group, a heteroaryl group, a heterocyclic group, a halogen, a haloalkane, a haloalkene, a haloalkyne, a cyano group, an aldehyde group, a carbonyl group, a carboxy group, an ester group, a carbamoyl group, an amino group, a nitro group, a silyl group, a siloxanyl group, and a ring structure formed between adjacent substituents. $Ar^1$ to $Ar^4$ may be the same or different from each other and are groups represented by Formula (2).

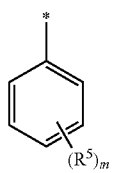
(2)

In Formula (2), $R^5$ is selected from the group consisting of an alkyl group, a cycloalkyl group, an alkoxy group, and an alkylthio group. m is an integer of 1 to 3. When the integer m is 2 or more, each $R^5$ may be the same as each other or may be different from each other, with the proviso that $Ar^1 \neq Ar^2$ or $Ar^3 \neq Ar^4$ and at least one of $Ar^1$ to $Ar^4$ is a group in which $R^5$ is an alkyl group or alkoxy group having 4 or more carbon atoms. Here, "≠" refers to groups having different structures. On the other hand, in Formula (1), $Ar^5$ is an aryl group or a heteroaryl group.

Among these substituents, hydrogen may be replaced with deuterium. In addition, the alkyl group refers to a saturated aliphatic hydrocarbon group such as a methyl group, an ethyl group, a n-propyl group, an isopropyl group, a n-butyl group, a sec-butyl group, and a tert-butyl group. This alkyl group may have a substituent or may have no substituent. When the alkyl group is substituted, the additional substituent is not particularly limited. Examples of the additional substituent include an alkyl group, an aryl group, and a heteroaryl group. This point is also common to the following description. In addition, the number of carbon atoms in the alkyl group is not particularly limited. The number is preferably in a range of 1 or more and 20 or less and more preferably 1 or more and 8 or less, from the viewpoints of availability and cost.

The cycloalkyl group refers to a saturated alicyclic hydrocarbon group such as cyclopropyl, cyclohexyl, norbornyl, and adamantyl and may have a substituent or may have no substituent. The number of carbon atoms in the alkyl group portion is not particularly limited. The number is preferably in a range of 3 or more and 20 or less.

The aralkyl group refers to an aromatic hydrocarbon group through an aliphatic hydrocarbon such as a benzyl group and a phenylethyl group. Any of these aliphatic hydrocarbons and aromatic hydrocarbons may be unsubstituted or may have a substituent.

The alkenyl group refers to an unsaturated aliphatic hydrocarbon group containing a double bond such as a vinyl group, an allyl group, and a butadienyl group and may have a substituent or may have no substituent. The number of carbon atoms in the alkenyl group is not particularly limited. The number is usually in a range of 2 or more and 20 or less.

The cycloalkenyl group refers to an unsaturated alicyclic hydrocarbon group containing a double bond such as a cyclopentenyl group, a cyclopentadienyl group, and a cyclohexenyl group and may have a substituent or may have no substituent.

The alkynyl group refers to an unsaturated aliphatic hydrocarbon group containing a triple bond such as an ethynyl group and may have a substituent or may have no substituent. The number of carbon atoms in the alkynyl group is not particularly limited. The number is usually in a range of 2 or more and 20 or less.

The alkoxy group refers to a functional group in which an aliphatic hydrocarbon group is bonded through an ether bond such as a methoxy group, an ethoxy group, and a propoxy group. This aliphatic hydrocarbon group may have a substituent or may have no substituent. The number of carbon atoms in the alkoxy group is not particularly limited. The number is preferably in a range of 1 or more and 20 or less.

The alkylthio group is a group in which the oxygen atom of the ether bond in the alkoxy group is substituted with a sulfur atom. The hydrocarbon group in the alkylthio group may have a substituent or may have no substituent. The number of carbon atoms in the alkylthio group is not particularly limited. The number is usually in a range of 1 or more and 20 or less.

The aryl ether group refers to a functional group in which an aromatic hydrocarbon group is bonded through an ether bond such as a phenoxy group and the aromatic hydrocarbon group may have a substituent or may have no substituent. The number of carbon atoms in the aryl ether group is not particularly limited. The number is preferably in a range of 6 or more and 40 or less.

The aryl thioether group is a group in which the oxygen atom of the ether bond in the aryl ether group is substituted with a sulfur atom. The aromatic hydrocarbon group in the aryl thioether group may have a substituent or may have no substituent. The number of carbon atoms in the aryl thioether group is not particularly limited. The number is usually in a range of 6 or more and 40 or less.

The aryl group refers to an aromatic hydrocarbon group such as a phenyl group, a naphthyl group, a biphenyl group, a fluorenyl group, a phenanthryl group, a triphenylenyl group, and a terphenyl group. The aryl group may have a substituent or may have no substituent. The number of carbon atoms in the aryl group is not particularly limited. The number is preferably in a range of 6 or more and 40 or less.

The heteroaryl group is a cyclic aromatic group having one or more atoms other than carbon in the ring such as a furanyl group, a thiophenyl group, a pyridyl group, a quinolinyl group, a pyrazinyl group, a pyrimidininyl group, a triazinyl group, a naphthyridyl group, a benzofuranyl group, a benzothiophenyl group, and an indolyl group and may be unsubstituted or substituted. The number of carbon atoms in the heteroaryl group is not particularly limited. The number is preferably in a range of 2 or more and 30 or less.

The heterocyclic group refers to an aliphatic ring having an atom other than carbon in the ring such as a pyran ring, a piperidine ring, and a cyclic amide and may have a substituent or may have no substituent. The number of carbon atoms in the heterocyclic group is not particularly limited. The number is usually in a range of 2 or more and 20 or less.

The halogen refers to fluorine, chlorine, bromine or iodine. A haloalkane, a haloalkene, and a haloalkyne are groups in which a portion or all of the alkyl group, the alkenyl group, and the alkynyl group are substituted with the halogen such as trifluoromethyl group and the remaining portion may be unsubstituted or substituted. The aldehyde group, the carbonyl group, the ester group, and the carbamoyl group also include groups substituted with an aliphatic hydrocarbon, an alicyclic hydrocarbon, an aromatic hydrocarbon, a heterocyclic ring, and the like and further the aliphatic hydrocarbon, the alicyclic hydrocarbon, the aromatic hydrocarbon, and heterocyclic ring may be unsubstituted or substituted. The amino group may have a substituent or may have no substituent, and examples of the substituent include an alkyl group, an aryl group, and a heteroaryl group and these substituents may be further substituted.

The silyl group refers to a functional group having a bond to a silicon atom such as a trimethylsilyl group and may have a substituent or may have no substituent. The number of carbon atoms in the silyl group is not particularly limited. The number is usually in a range of 3 or more and 20 or less. In addition, the number of silicon is usually 1 or more and 6 or less. The siloxanyl group refers to a silicon compound group through an ether bond such as a trimethylsiloxanyl group and may be unsubstituted or substituted.

In addition, any adjacent two substituents (for example, $R^1$ and $Ar^2$ in Formula (1)) may be bonded to each other to form a conjugated or nonconjugated condensed ring. The constituent element of such a condensed ring may include an element selected from nitrogen, oxygen, sulfur, phosphorus, and silicon in addition to carbon. In addition, such a condensed ring may be further condensed with another ring. Considering the availability of materials and ease of synthesis, both $R^3$ and $R^4$ in Formula (1) are preferably fluorine.

In the compound represented by Formula (1), $Ar^1$ to $Ar^4$ are substituents represented by Formula (2), whereby both high color purity and high durability can be achieved at the same time. Here, $Ar^1 \neq Ar^2$ or $Ar^3 \neq Ar^4$. The term "$\neq$" herein means groups having different structures. $Ar^1 \neq Ar^2$ or $Ar^3 \neq Ar^4$ means, in other words, that "$Ar^1=Ar^2$ and $Ar^3=Ar^4$" are not satisfied. More specifically, this term means that the combinations in which (1) $Ar^1=Ar^2=Ar^3=Ar^4$ and (2) $Ar^1=Ar^2$ and $Ar^3=Ar^4$ and $Ar^1 \neq Ar^3$ are excluded among any combinations of $Ar^1$ to $Ar^4$. When $Ar^1 \neq Ar^2$ or $Ar^3 \neq Ar^4$, the dispersibility in the film is improved and high-efficiency light emission is obtained.

The aryl group represented by Formula (2) affects various characteristics and physical properties such as light emission efficiency, color purity, heat resistance, and light resistance of the compound represented by Formula (1). Although some aryl groups that improve multiple properties exist, no aryl groups that exhibit sufficient performance in all properties exist. In particular, achieving both high light emission efficiency and high color purity at the same time is difficult. Therefore, when a plurality of kinds of aryl groups can be introduced into the compound represented by Formula (1), it is expected that a compound that is well-balanced in light emission characteristics, color purity, and the like is obtained.

Compounds in which $Ar^1=Ar^2=Ar^3=Ar^4$ can have only one kind of aryl group. In addition, in the case of compounds in which $Ar^1=Ar^2$ and $Ar^3=Ar^4$ and $Ar^1 \neq Ar^3$, the aryl group having specific physical properties is inclined to one of the pyrrole rings. In this case, the physical properties possessed by each aryl group are difficult to maximize as described below in relation to the light emission efficiency and the color purity.

On the other hand, in the compound according to the embodiment of the present invention, substituents having certain physical properties can be arranged on the left and right pyrrole rings in a well-balanced manner, and thus physical properties can be maximized compared with the case where the substituents having certain properties are inclined to one of the pyrrole rings.

This effect is particularly excellent in terms of improving the light emission efficiency and the color purity in a well-balanced manner. Each of the pyrrole rings on both sides preferably has one or more aryl groups affecting the color purity from the viewpoint that the conjugated system is expanded to obtain light emission with high color purity. However, when aryl groups affecting the color purity are introduced into one pyrrole ring and aryl groups affecting the light emission efficiency are introduced into the other pyrrole ring for example, the conjugated system of the compound of $Ar^1=Ar^2$ and $Ar^3=Ar^4$ and $Ar^1 \neq Ar^3$ is not sufficiently expanded and thus the color purity is not sufficiently improved because the aryl group affecting the color purity is inclined to one of the pyrrole rings. In addition, when the aryl groups affecting the color purity and having another structure are introduced into the other pyrrole ring in a similar manner, the light emission efficiency cannot be improved.

On the contrary, the compound according to the embodiment of the present invention can introduce one or more aryl groups affecting the color purity on each of the pyrrole rings on both sides and the aryl groups affecting the light emission efficiency can be introduced at other positions. Consequently, the compound according to the embodiment of the present invention can maximize the properties of both color purity and light emission efficiency and thus is preferable. In the case of introducing the aryl group affecting the color purity at the positions of $Ar^2$ and $Ar^3$, the conjugated system is most expanded, which is preferable.

When $R^5$ in the aryl group represented by Formula (2) is an electron-donating group, this aryl group is preferable because this aryl group mainly affects the color purity. Examples of the electron-donating group include an alkyl group, a cycloalkyl group, an alkoxy group, and an alkylthio group. In particular, an aryl group substituted with an alkyl group having 1 to 8 carbon atoms, a cycloalkyl group having 1 to 8 carbon atoms, an alkoxy group having 1 to 8 carbon atoms, or an alkylthio group having 1 to 8 carbon atoms is preferable. When $R^5$ as the electron-donating group is an alkyl group having 1 to 8 carbon atoms or an alkoxy group having 1 to 8 carbon atoms, the substituted aryl group is more preferable because higher color purity can be obtained. In addition, as the aryl group mainly affecting the light emission efficiency, an aryl group having a bulky substituent such as a t-butyl group and an adamantyl group is preferable.

In addition, from the viewpoint of improving both heat resistance and color purity, $Ar^1$ and $Ar^4$, and $Ar^2$ and $Ar^3$ each are preferably aryl groups having the same structure. Moreover, from the viewpoint of dispersibility, at least one of $Ar^1$ to $Ar^4$ is a group represented by Formula (2) and $R^5$ is an alkyl group having 4 or more carbon atoms. In addition, more preferably at least one of $Ar^1$ to $Ar^4$ is a group represented by Formula (2) and $R^5$ is an alkoxy group. Among them, the t-butyl group is a bulky substituent and thus is preferable from the viewpoint of improvement of durability because thermal aggregation of the light emitting material is prevented. A methoxy group or a t-butoxy group is particularly preferably included in terms of providing high color purity because the group is an electron donating substituent and contributes to the lengthening of light emission wavelength.

m in Formula (2) is preferably an integer of 1 to 3. From the viewpoint of raw material availability and ease of synthesis, the integer m is more preferably "1" or "2".

In addition, $Ar^5$ in Formula (1) is preferably an aryl group or a heteroaryl group from the viewpoint of improving both light emission, characteristics and heat resistance. Moreover, $Ar^5$ is preferably an unsubstituted phenyl group or a phenyl group having at least one substituent selected from the group consisting of an alkyl group, an alkoxy group, a halogen, and a ring structure formed between adjacent substituents. In particular, from the viewpoint of heat resistance, $Ar^5$ is more preferably an unsubstituted phenyl group or a phenyl group having at least one substituent selected from the group consisting of a methyl group, a methoxy group, a t-butyl group, and a ring structure formed between adjacent substituents. Among them, when at least one of the substituents is a methoxy group, highly efficient light emission can be achieved, which is more preferable. In particular, when the methoxy group is bonded to the ortho position of Ar⁵, the molecular structure is stabilized by adopting a twisted structure and thus highly efficient light emission can be achieved, which is further preferable.

Examples of compounds having a pyrromethene skeleton represented by Formula (1) are illustrated below.

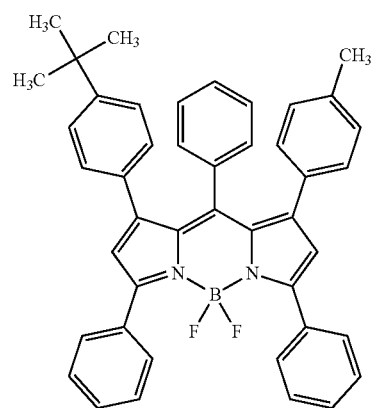

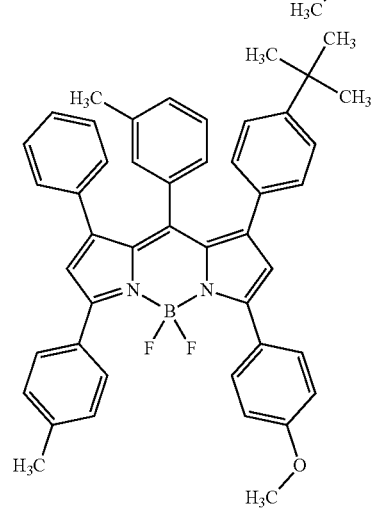

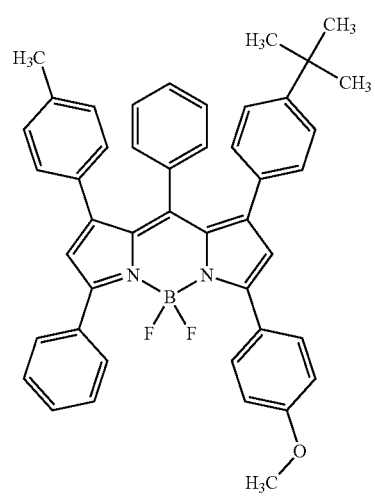

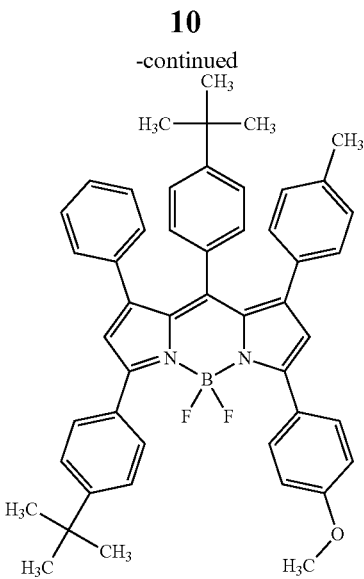

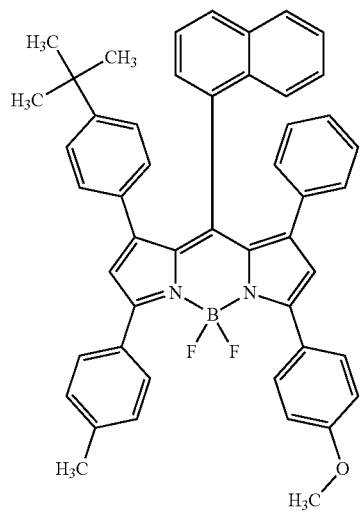

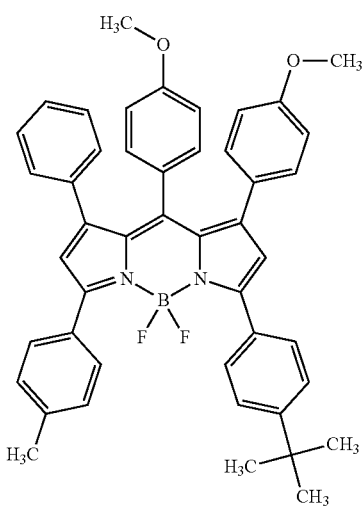

-continued
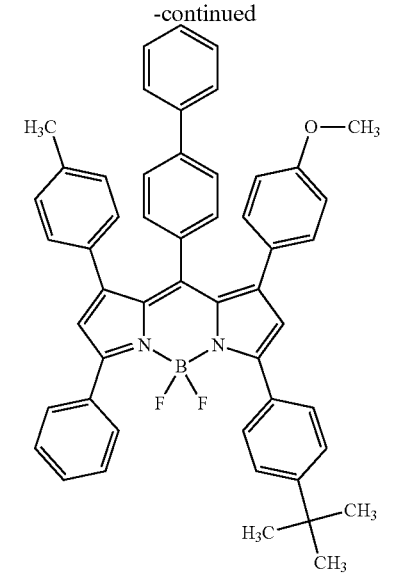
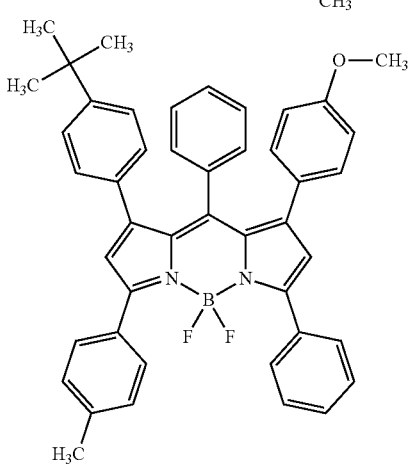
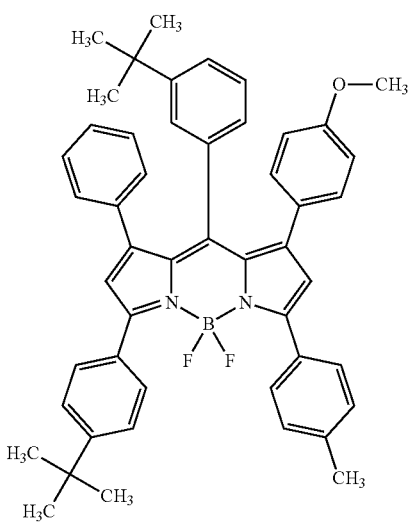
-continued
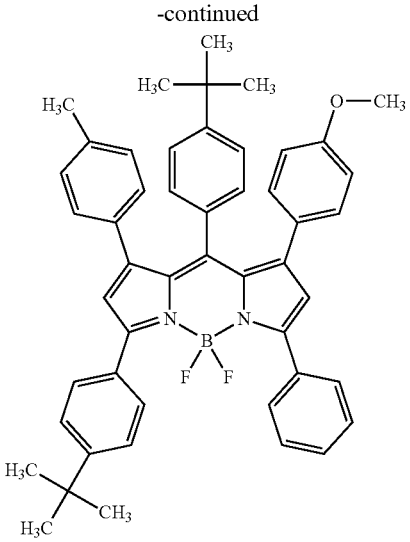
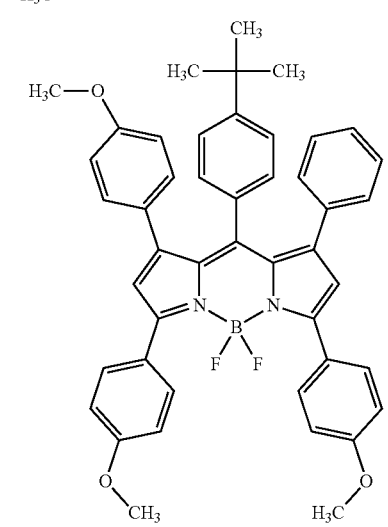
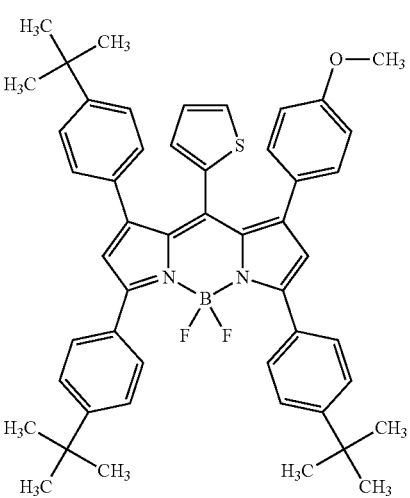

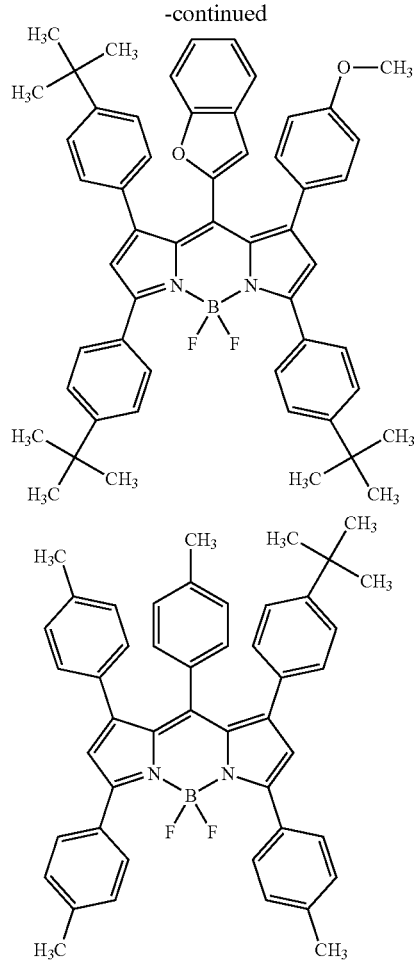
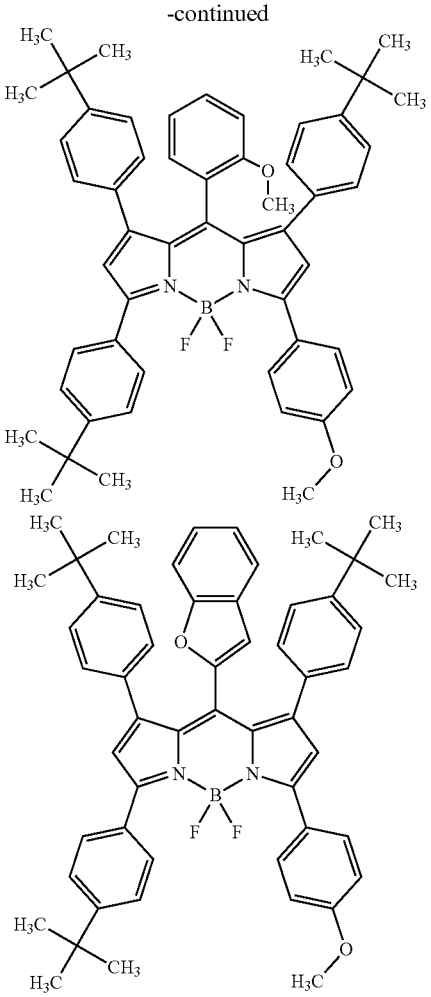
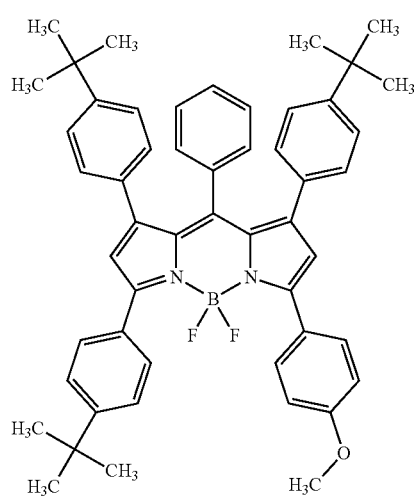
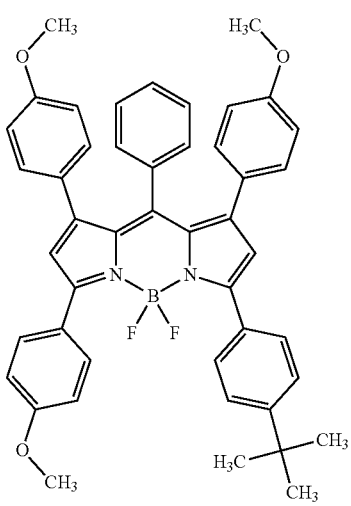

-continued
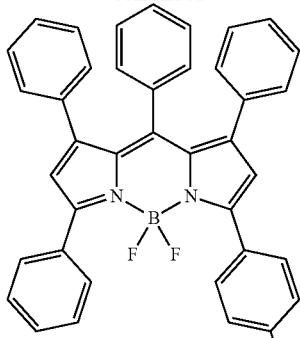
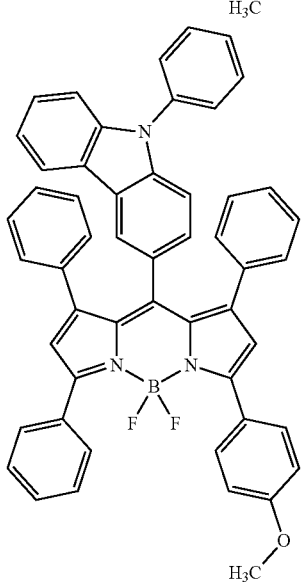
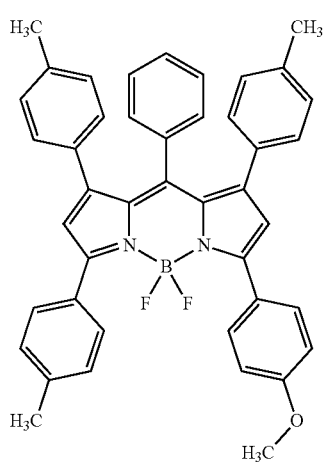
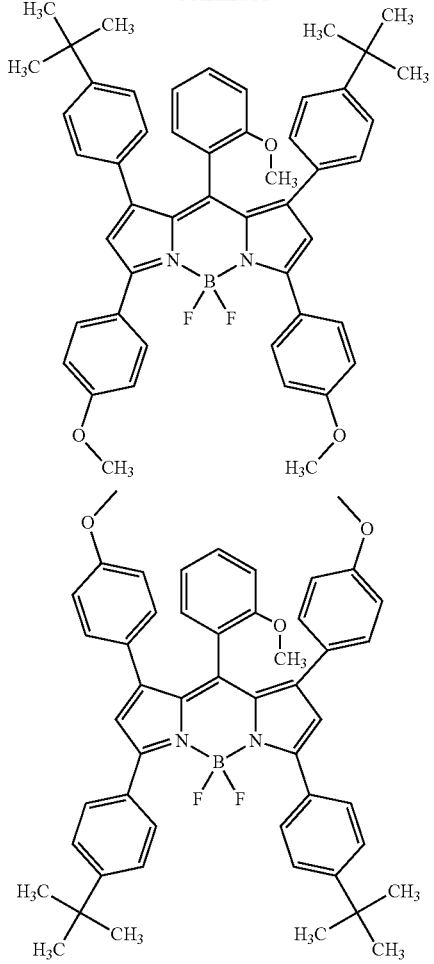
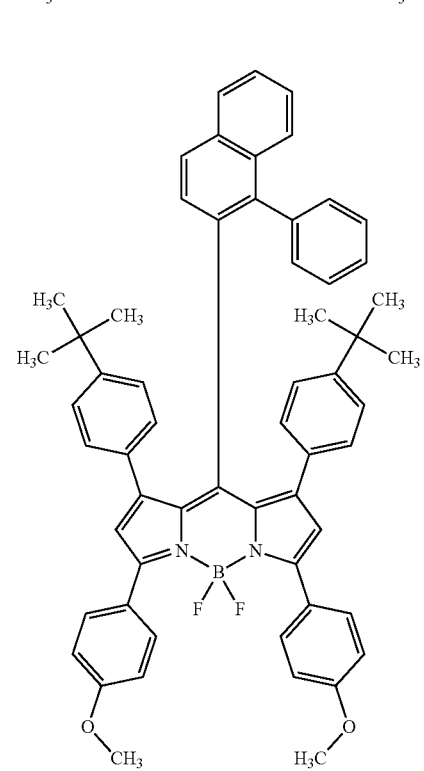

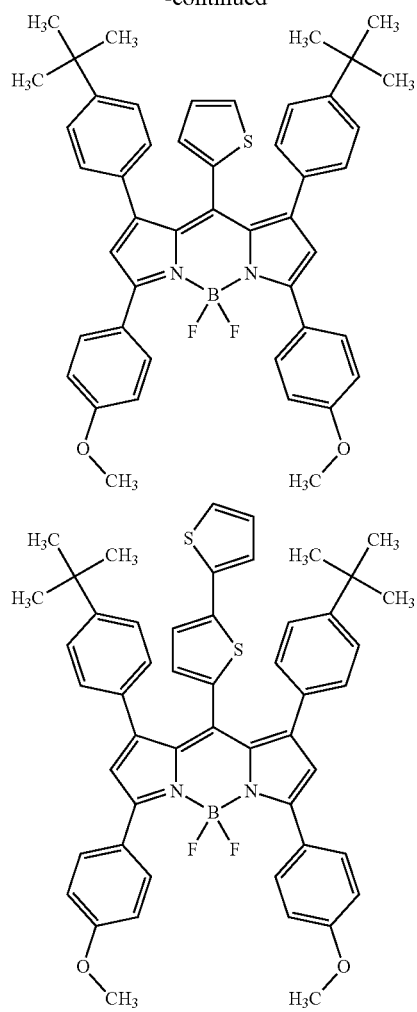
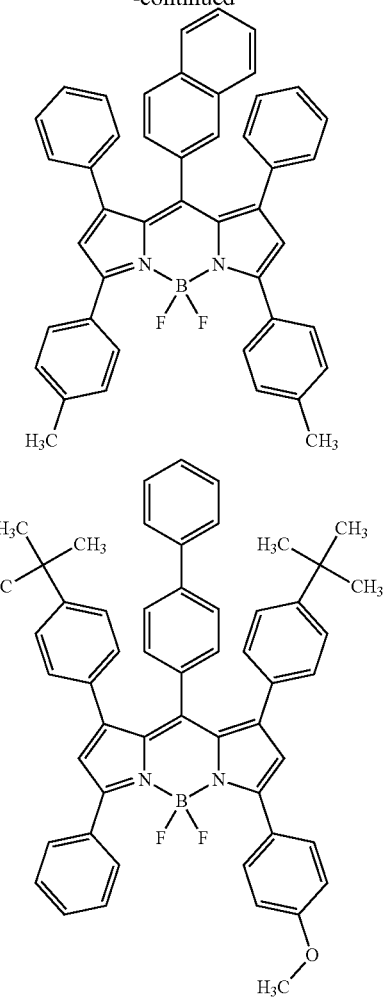
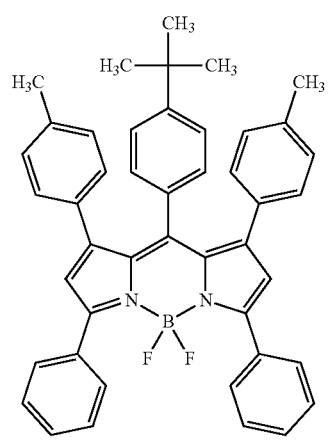
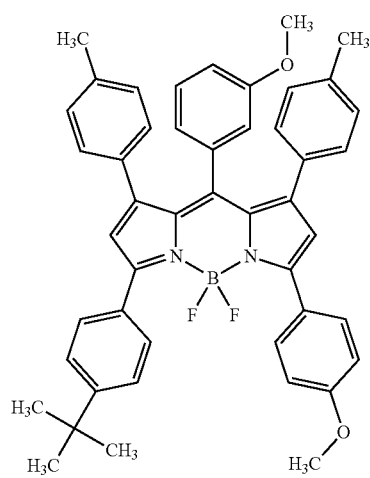

-continued
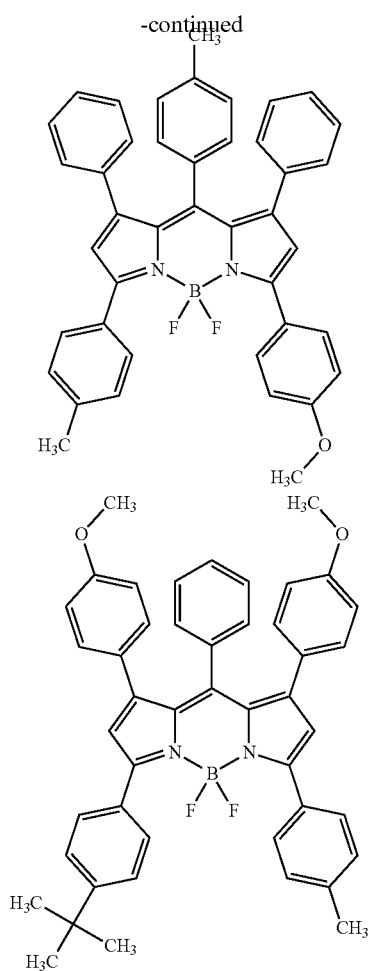
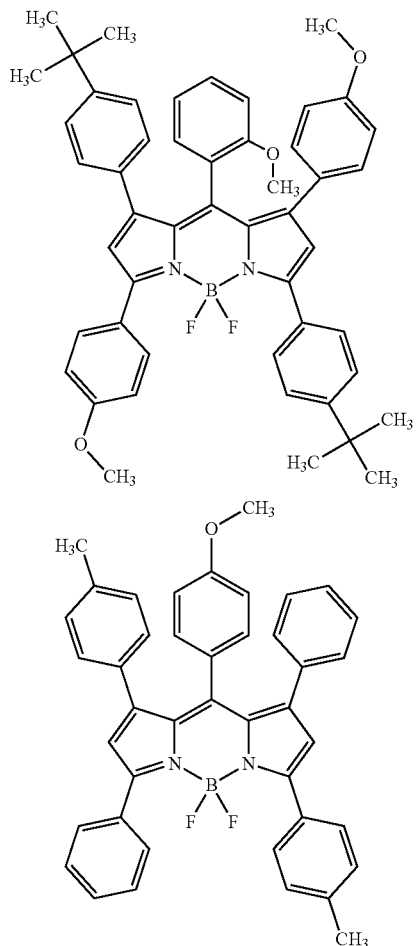
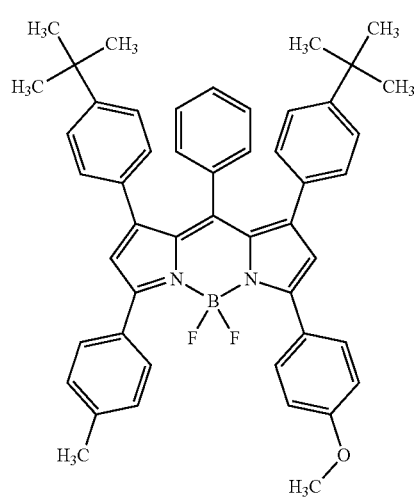
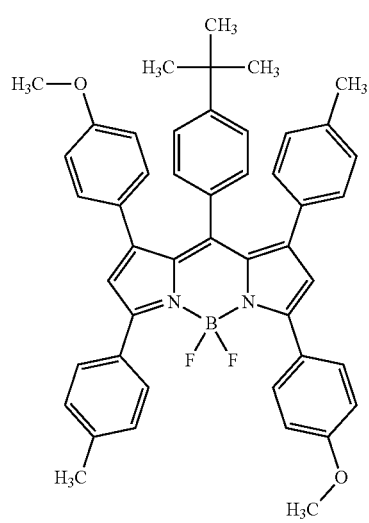

-continued
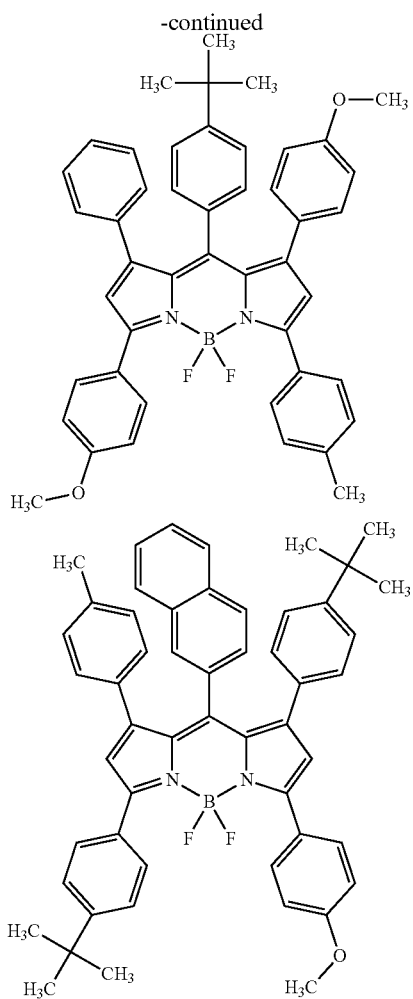
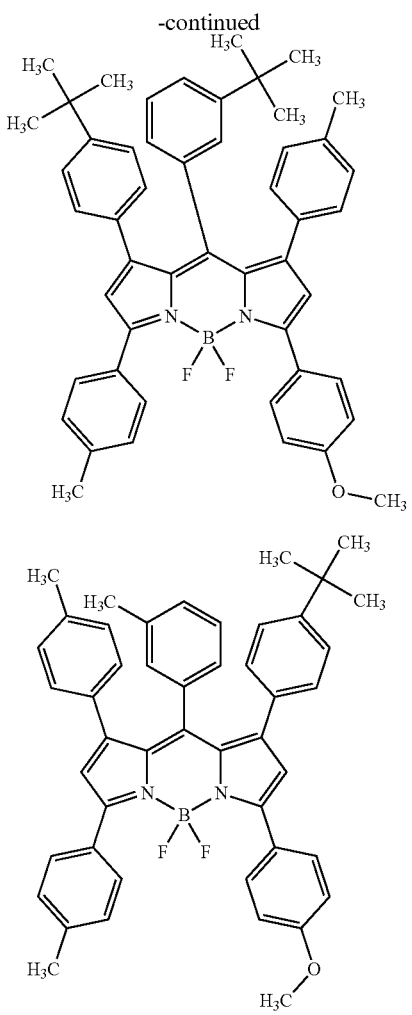
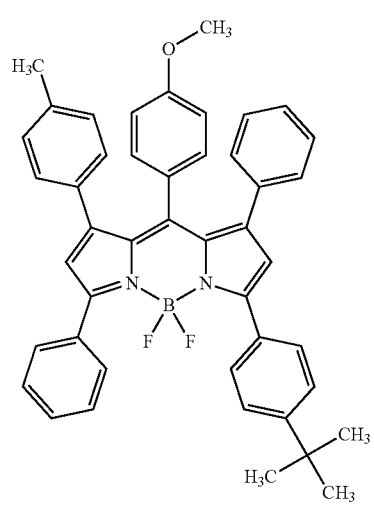
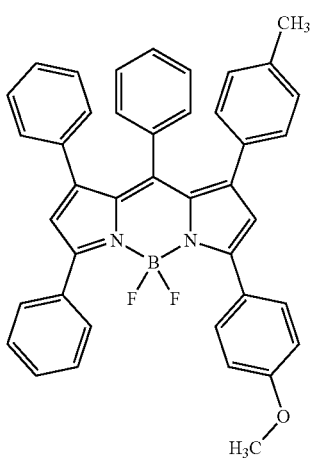

23
-continued
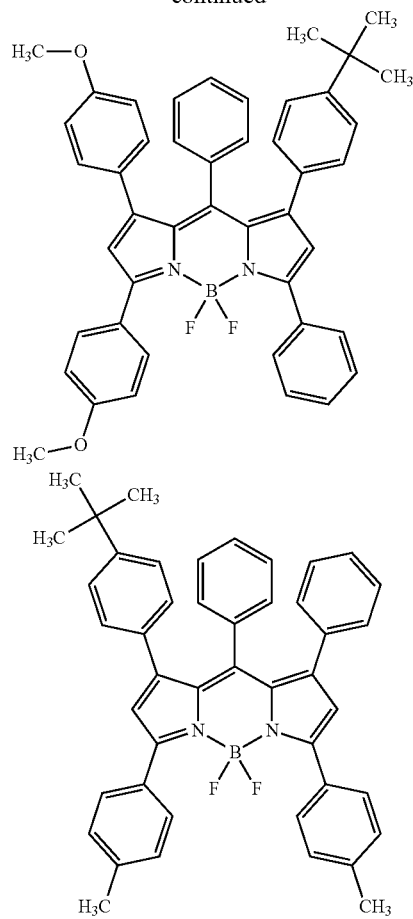
24
-continued
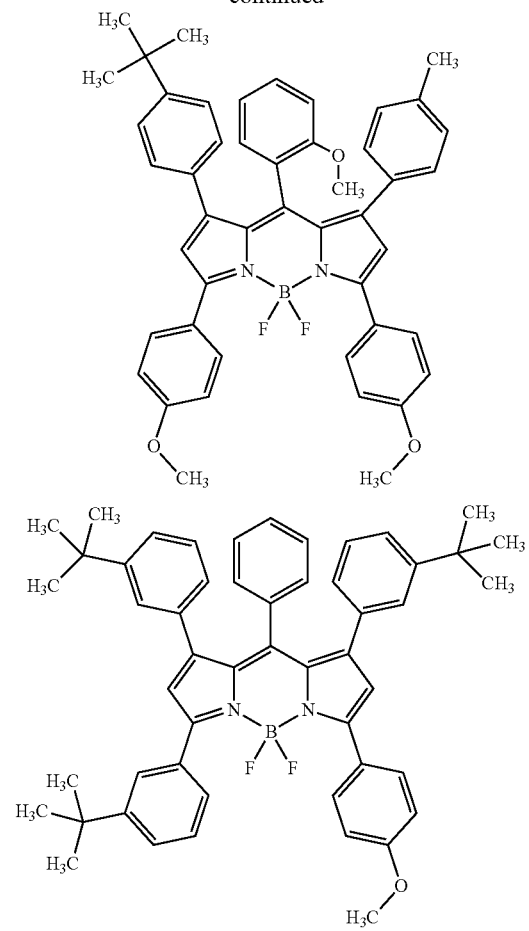
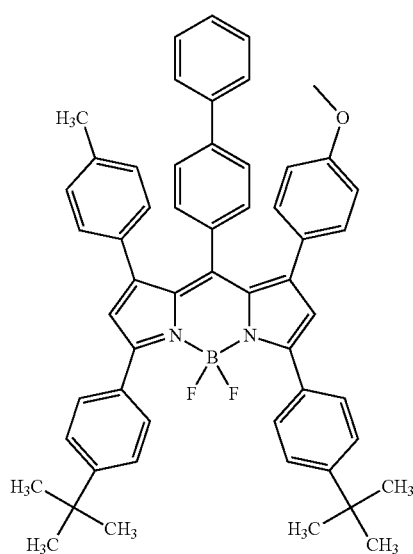
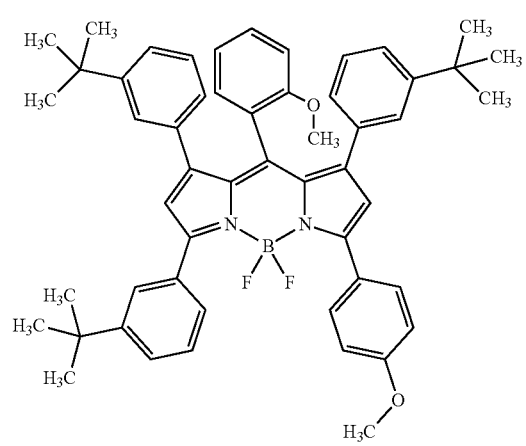

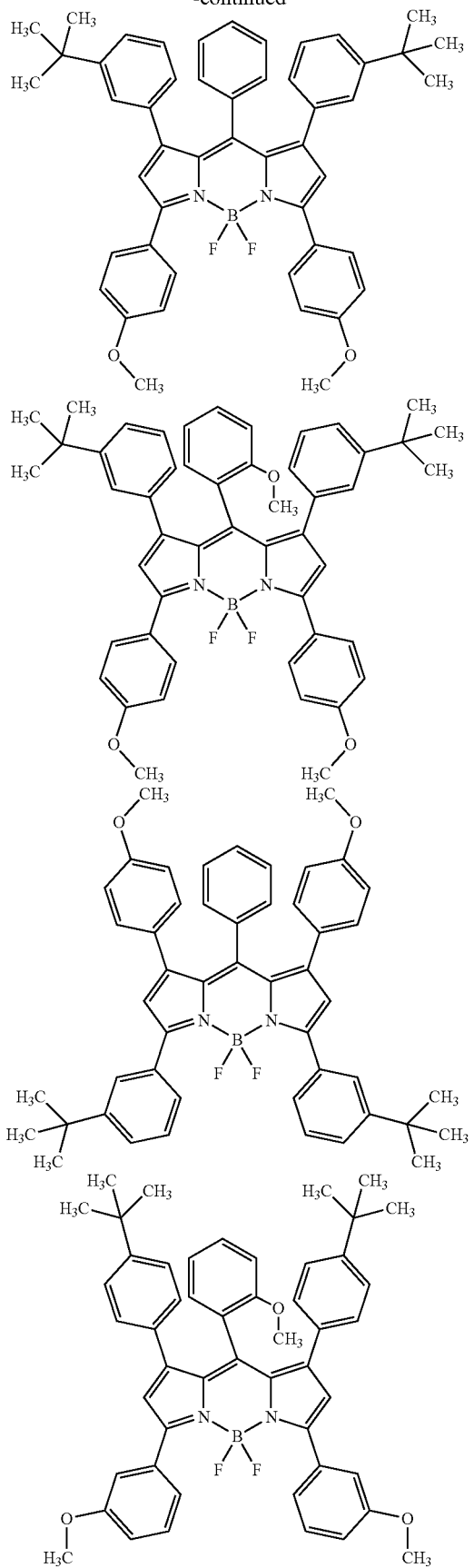
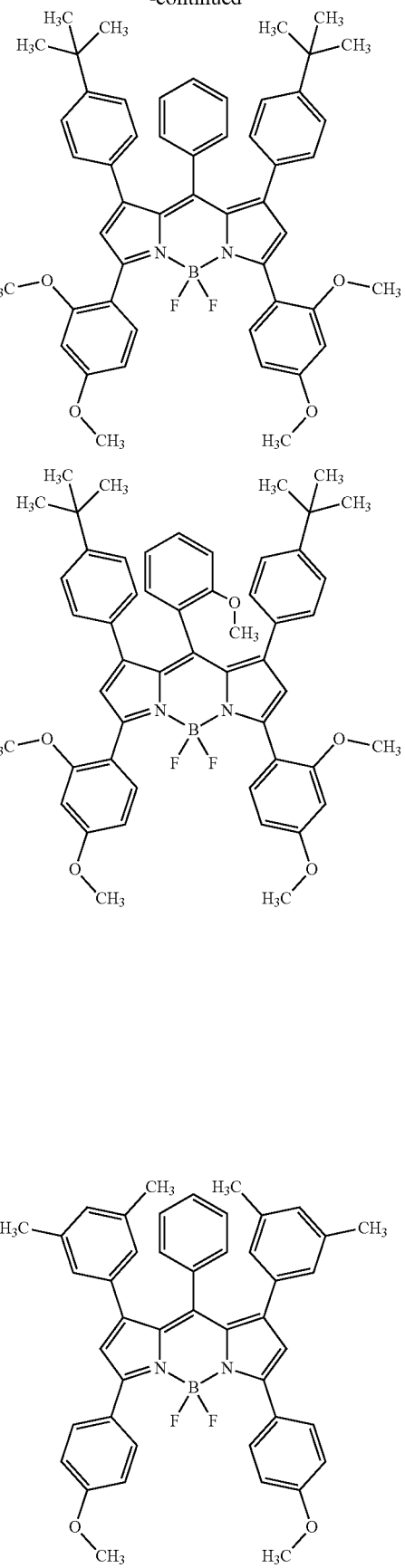

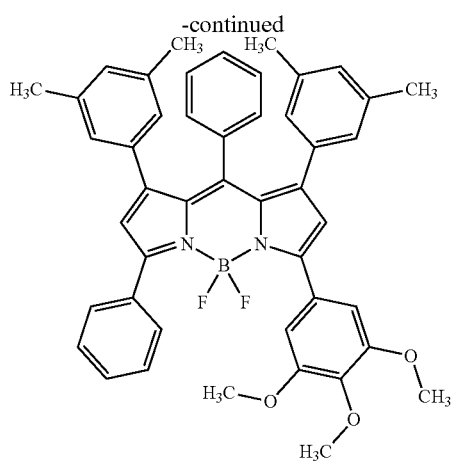

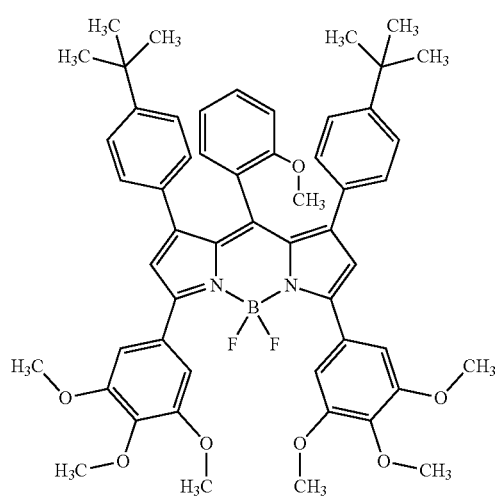

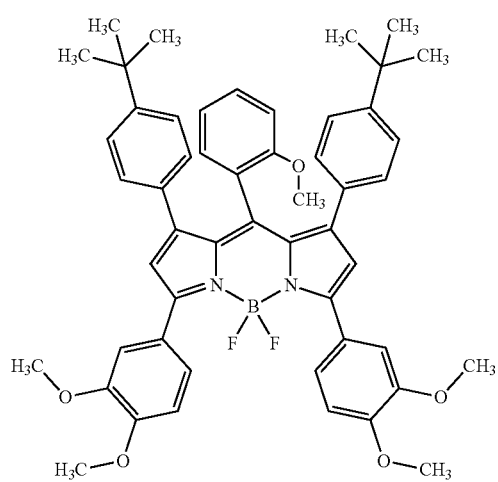

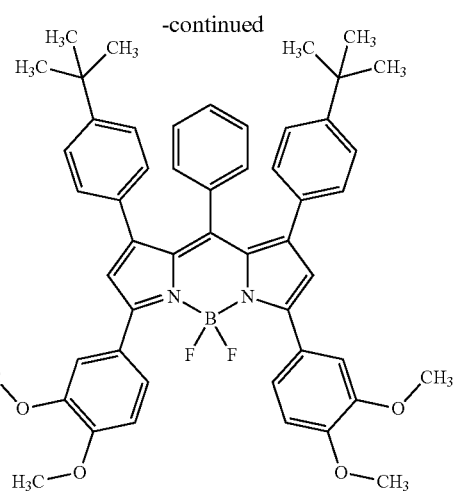

Known methods can be used for synthesizing the compound represented by Formula (1). For example, the compound represented by Formula (1) can be obtained by heating a compound represented by Formula (3) and a compound represented by Formula (4) in 1,2-dichloroethane in the presence of phosphorus oxychloride and thereafter reacting a compound represented by Formula (5) with the heated compounds in 1,2-dichloroethane in the presence of triethylamine. Here, $Ar^1$ to $Ar^5$ and $R^1$ to $R^4$ are the same as those illustrated in the above-described Formula (1). J represents a halogen.

(3)

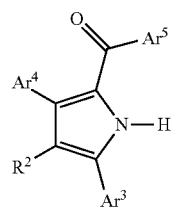

(4)

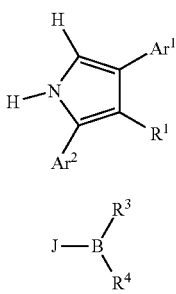

(5)

The color conversion composition according to the embodiment of the present invention may appropriately contain other compounds, if necessary, in addition to the compound represented by Formula (1). For example, in order to further enhance energy transfer efficiency from excitation light to the compound represented by Formula (1), an assist dopant such as rubrene may be contained. In addition, when a luminescent color other than the luminescent color of the compound represented by Formula (1) is intended to be added, compounds such as a coumarin-based dye, a perylene-based dye, a phthalocyanine-based dye, a stilbene-based dye, a cyanine-based dye, a polyphenylene-based dye, a rhodamine-based dye, a pyridine-based dye, a pyrromethene-based dye, a porphyrin-based dye, an oxazine-based dye, and a pyrazine-based dye can be added. In addition to the above-described organic compounds, other known fluorescent materials such as inorganic fluorescent materials, fluorescent pigments, fluorescent dyes, and quantum dots can be combined and added.

The compound represented by Formula (1) is preferably a compound that exhibits red light emission by using a light source having a maximum light emission peak in a region of 400 nm to 500 nm. Here, the red light emission means light emission in which a light emission peak wavelength is observed in a region of 580 nm to 750 nm. In general, as the energy of the excitation light becomes larger, the decomposition of the material is more likely to occur. However, the excitation light in a range of 400 nm to 500 nm emitted by the above-described light source has relatively low excitation energy and thus the compound represented by Formula (1) can provide red light emission with good color purity without causing decomposition of the compound.

The color conversion composition according to the embodiment of the present invention preferably further includes a compound (hereinafter referred to as a "green compound") that emits green light when the green compound is excited by a light source having a maximum light emission peak in a region of 400 nm to 500 nm. Here, the green light emission means light emission in which a light emission peak wavelength is observed in a region of 500 nm to 580 nm. The compound represented by Formula (1) exhibits red light emission when the compound is excited by one of or both of a light source having a maximum light emission peak in a region of 400 nm to 500 nm and green light emitted by the green compound. A part of the excitation light in a range of 400 nm to 500 nm transmits a part of the color conversion film according to the embodiment of the present invention and thus, when a blue LED with a sharp light emission peak is used, a sharp-shaped light emission spectrum is exhibited in each color of blue, green, and red. Consequently, white light having good color purity can be obtained. As a result, particularly in displays, a larger color gamut with more vivid colors can be efficiently produced. In addition, in lighting applications, color rendering properties are improved and a preferable white light source can be provided because the light emission characteristics of the green region and the red region are improved compared with white LED formed by combining the blue LED and the yellow fluorescent material, which is presently mainstream.

Examples of compounds emitting green light suitably include coumarin dyes: 2, 3, 5, 6-1H,4H-tetrahydro-8-trifluoromethylquinolizine (9,9a, 1-gh)coumarin (coumarin 153), 3-(2'-benzothiazolyl)-7-diethylaminocoumarin (coumarin 6), 3-(2'-benzimidazolyl)-7-N,N-diethylaminocoumarin (coumarin 7), naphthalimide dyes: Basic Yellow 51, Solvent Yellow 11, Solvent Yellow 116, and in addition pyridine dyes, pyrromethene dyes, phthalimide dyes, and iridium complexes. The compounds, however, are not particularly limited to these exemplified compounds.

Depending on a molar absorbance coefficient, a fluorescence quantum yield, and an absorption intensity at an excitation wavelength of the compound, and the thickness and the transmittance of a film to be produced, the content of the compound represented by Formula (1) in the color conversion composition according to the embodiment of the present invention is usually $10^{-4}$% by weight to 30% by weight, more preferably $10^{-3}$% by weight to 10% by weight, and particularly preferably $10^{-2}$% by weight to 5% by weight relative to the total weight of the color conversion composition. In addition, when the color conversion composition according to the embodiment of the present invention contains both compound exhibiting green light emission and compound exhibiting red light emission, the content ratio of each material is usually (compound emitting green light):(compound emitting red light)=1,000:1 to 1:1, further preferably 500:1 to 2:1, and particularly preferably 200:1 to 3:1 in a weight ratio due to conversion of a part of green light emission into red light emission.

<Binder Resin>

The binder resin forms a continuous phase and may be any material as long as the resin is excellent in moldability, transparency, heat resistance, and the like. Usable examples of known resins include photocurable-type resist materials having reactive vinyl groups such as an acrylic acid-based resin, a methacrylic acid-based resin, a polyvinyl cinnamate-based resin, and a cyclized rubber, an epoxy resin, a silicone resin (including organopolysiloxane cured products (cross-linked products) such as a silicone rubber and a silicone gel), a urea resin, a fluorocarbon resin, a polycarbonate resin, an acrylic resin, a urethane resin, a melamine resin, a polyvinyl resin, a polyamide resin, a phenol resin, a polyvinyl alcohol resin, a cellulose resin, an aliphatic ester resin, an aromatic ester resin, an aliphatic polyolefin resin, and an aromatic polyolefin resin. In addition, copolymer resins of these resins may also be used. A resin useful for the color conversion composition according to the embodiment of the present invention can be obtained by properly designing these resins. Among these resins, thermosetting resins are more preferable because the resins facilitate film formation process. From the viewpoint of transparency, heat resistance, and the like, an epoxy resin, a silicone resin, an acrylic resin, or a mixture thereof can be suitably used. The thermosetting resin contained in the binder resin may be a single resin or a combination of two or more of resins. The binder resin may contain a curing agent, if necessary. For example, curing of the epoxy resin can be promoted to cure the epoxy resin in a short time by combining the epoxy resin and the curing agent.

In addition, as additives, a dispersant or a leveling agent for stabilizing a coating film, an adhesion aid such as a silane coupling agent as a modifier for the film surface, and the like can also be added. In addition, inorganic particles such as silica particles and silicone fine particles can be added as an inhibitor for sedimentation of the color conversion material.

<Solvent>

The color conversion composition according to the embodiment of the present invention may contain a solvent. This solvent is not particularly limited as long as the solvent can adjust the viscosity of the resin in a flowing state and does not affect the deterioration of the compound represented by Formula (1). Examples of the solvent include toluene, methyl ethyl ketone, methyl isobutyl ketone, hexane, acetone, terpineol, texanol, methylcellosolve, butylcarbitol, butylcarbitol acetate, and propylene glycol monomethyl ether acetate. Two or more of these solvents can be mixed to be used. Among these solvents, toluene is particularly suitably used from the viewpoint that toluene does not affect the deterioration of the compound represented by Formula (1) and that the amount of the residual solvent after drying is small.

<Method for Producing Color Conversion Composition>

Hereinafter, one example of a method for producing the color conversion composition according to the embodiment of the present invention will be described. In this production method, the compound represented by Formula (1), the binder resin, the solvent, and the like are mixed in predetermined amounts. The components are mixed so as to have a predetermined composition and thereafter homogeneously mixed and dispersed with a stirring-kneading machine such as a homogenizer, a rotating-revolving stirrer, a three-roller, a ball mill, a planetary ball mill, and a bead mill to give the color conversion composition. Defoaming under vacuum or reduced pressure conditions after the mixing and dispersing processes or during the mixing and dispersing processes is also preferably carried out. In addition, certain components may be previously mixed or treatment such as aging may be carried out. The desired solid content can also be obtained by removing the solvent with an evaporator.

<Method for Producing Color Conversion Film>

Figure 2:
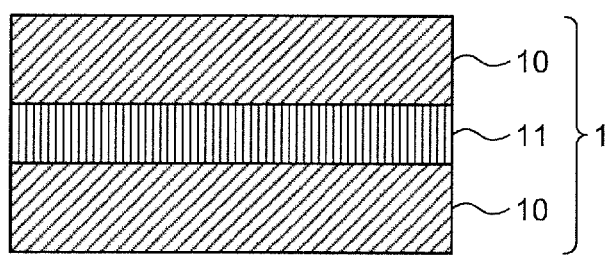
FIG. 2 is a schematic sectional view illustrating another example of a color conversion film according to the embodiment of the present invention.
Figure 3:
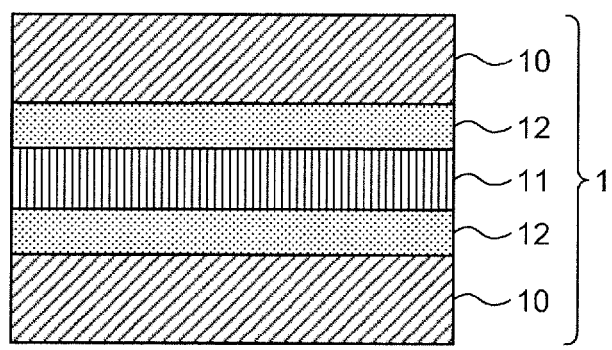
FIG. 3 is a schematic sectional view illustrating further another example of a color conversion film according to the embodiment of the present invention.

The configuration of the color conversion film according to the embodiment of the present invention is not limited as long as the film includes a layer obtained by curing the above-described color conversion composition according to the present embodiment. FIG. 1 is a schematic sectional view illustrating one example of a color conversion film according to the embodiment of the present invention. FIG. 2 is a schematic sectional view illustrating another example of a color conversion film according to the embodiment of the present invention. FIG. 3 is a schematic sectional view illustrating further another example of a color conversion film according to the embodiment of the present invention. As a representative structure example of the color conversion film 1, a laminated body made of a substrate layer 10 and a color conversion layer 11 obtained by curing the color conversion composition according to the embodiment of the present invention may be included as illustrated in FIG. 1. In addition, as another structure example of the color conversion film 1, a laminated body in which the color conversion layer 11 is sandwiched with a plurality of substrate layers 10 may be included as illustrated in FIG. 2. Alternatively, in the color conversion film 1, a barrier film layer 12 is further provided between the substrate layer 10 and the color conversion layer 11 as illustrated in FIG. 3 in order to prevent deterioration of the color conversion layer 11 due to oxygen, moisture, and heat.

(Substrate Layer)

As the substrate layer 10, a known metal, film, glass, ceramic, paper, or the like can be used without any particular limitation. Specific examples of the substrate layer 10 include plates or foils made of metals such as aluminum (including aluminum alloy), zinc, copper, and iron; films made of plastics such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, a thermoplastic fluorocarbon resin, a copolymer of tetrafluoroethylene and ethylene (ETFE); films made of plastics such as an a-polyolefin resin, a polycaprolactone resin, an acrylic resin, a silicone resin, and copolymer resins of these resins with ethylene; papers laminated with the plastics or paper coated with the plastics, papers laminated or vapor-deposited with the metals, and plastic films laminated or vapor-deposited with the metals. In addition, when the substrate layer 10 is the metal plate, the surface of the metal plate may be subjected to chromium-based or nickel-based plating treatment or ceramic treatment.

Among them, the glass or the resin film is preferably used from the viewpoint of ease of preparation of the color conversion film 1 and ease of forming of the color conversion film 1. In addition, a film having high strength is preferable so that breakage or the like when the film-like substrate is handled may not occur. The resin film is preferable from the viewpoint of required characteristics and economic efficiency. Among them, the plastic film selected from the group consisting of PET, polyphenylene sulfide, polycarbonate, and polypropylene is preferable from the viewpoint of economic efficiency and handling. In addition, from the viewpoint of heat resistance, the polyimide film is preferable when the color conversion film 1 is dried and when the color conversion film 1 is compression-bonded by an extruder at a high temperature of 200° C. or higher. From the ease of peeling of the sheet, the surface of the substrate layer 10 may be previously subjected to releasing treatment.

The thickness of the substrate layer 10 is not particularly limited. The lower limit of the thickness is preferably 25 μm or thicker and more preferably 38 μm or thicker. In addition, the upper limit of the thickness is preferably 5,000 μm or thinner and more preferably 3,000 μm or thinner.

(Color Conversion Layer)

Subsequently, one example of a method for producing the color conversion layer 11 of the color conversion film 1 according to the embodiment of the present invention will be described. In this production method, the color conversion composition produced by the above-described method is applied onto the substrate and dried. The application can be carried out using a reverse roll coater, a blade coater, a slit die coater, a direct gravure coater, an offset gravure coater, a kiss coater, a natural roll coater, an air knife coater, a roll blade coater, a burr-bar roll blade coater, a two stream coater, a rod coater, a wire bar coater, an applicator, a dip coater, a curtain coater, a spin coater, a knife coater, or the like. In order to obtain the film thickness uniformity of the color conversion layer 11, the color conversion layer 11 is preferably applied with the slit die coater.

Drying of the color conversion layer 11 can be carried out using a general heating device such as a hot air dryer or an infrared dryer. For heating the color conversion film 1, a general heating device such as a hot air dryer or an infrared dryer is used. In this case, the heating conditions are usually 40° C. to 250° C. for 1 minute to 5 hours and preferably 60° C. to 200° C. for 2 minutes to 4 hours. In addition, the color conversion film 1 can also be cured stepwise by heating such as step curing.

After the color conversion layer 11 is prepared, the substrate can be changed, if needed. In this case, examples of simple methods include a method for replacing the substrate by using a hot plate and a method using a vacuum laminator or a dry film laminator. The methods, however, are not limited to these methods.

The thickness of the color conversion layer 11 is not particularly limited and is preferably 10 μm to 1,000 μm. When the thickness of the color conversion layer 11 is thinner than 10 μm, a problem in which the toughness of the color conversion film 1 is lowered arises. When the thickness of the color conversion layer 11 exceeds 1,000 μm, a problem in which cracks are likely to occur, and as a result, molding of the color conversion film 1 becomes difficult arises. The thickness of the color conversion layer 11 is more preferably 30 μm to 100 μm.

On the other hand, from the viewpoint of enhancing the heat resistance of the color conversion film 1, the film thickness of the color conversion film 1 is preferably 200 μm or thinner, more preferably 100 μm or thinner, and further preferably 50 μm or thinner.

In the embodiment of the present invention, the film thickness of the color conversion film 1 refers to a film thickness (average film thickness) measured based on the method A for measuring a thickness by mechanical scanning in "Plastics-Film and sheeting-Determination" of JIS K 7130 (1999).

(Barrier Film)

The barrier film forming the barrier film layer 12 (refer to FIG. 3) of the color conversion film 1 according to the embodiment of the present invention is appropriately used, for example, in the case of improving the gas barrier property with respect to the color conversion layer 11. Examples of the barrier film may include a metal oxide thin film such as silicon oxide, aluminum oxide, tin oxide, indium oxide, yttrium oxide, magnesium oxide, a mixture thereof, or the metal oxide thin film to which other elements are added thereto, or films made of various resins such as polyvinylidene chloride, an acrylic-based resin, a silicon-based resin, a melamine-based resin, a urethane-based resin, and a fluorocarbon-based resin. In addition, examples of a film having a barrier function against moisture include films made of various resins such as polyethylene, polypropylene, nylon, polyvinylidene chloride, a copolymer of vinylidene chloride and vinyl chloride, a copolymer of vinylidene chloride and acrylonitrile, and a fluorocarbon-based resin.

In addition, depending on the required function of the color conversion film 1, auxiliary layers having an antireflection function, an antiglare function, an antireflection antiglare function, a light diffusion function, a hard coat function (friction resistance function), an antistatic function, an antifouling function an electromagnetic wave shielding function, an infrared ray cutting function, an ultraviolet ray cutting function, a polarizing function, and a toning function may be further included.

<Excitation Light>

In the present invention, the kind of the excitation light is not limited as long as the excitation light exhibits light emission in a wavelength region that can be absorbed by the compound represented by Formula (1). As long as this condition is satisfied, any excitation light can be used. For example, excitation light of any light source such as a hot cathode tube, a cold cathode tube, a fluorescent light source such as inorganic EL, an organic electroluminescent element light source, LED, an incandescent light source, and sunlight can be used in principle. In particular, the LED light is suitable excitation light. In the applications for displays and lighting, a blue LED having excitation light in a range of 400 nm to 500 nm is a more suitable light source of the excitation light from the viewpoint of enhancing the color purity of blue light. When the wavelength range of the excitation light is in the longer wavelength side than this range, white light cannot be formed due to the lack of blue light, whereas when the wavelength range of the excitation light is in the shorter wavelength side than this range, the compound represented by Formula (1) or the organic compound such as the binder resin is likely to deteriorate by the light, which is not preferable.

Such excitation light may be excitation light having one kind of light emission peak or may be excitation light having two or more kinds of light emission peaks. In order to increase color purity, the excitation light having one kind of light emission peak is preferable. In addition, a plurality of excitation light sources having different kinds of light emission peaks can be used in any combinations.

<Backlight Unit>

The backlight unit in the present invention is one example of a light emitting device according to the present invention and has a configuration including at least the light source and the color conversion film (for example, the color conversion films 1 illustrated in FIGS. 1 to 3) according to the embodiment of the present invention. A method for arranging the light source and the color conversion film is not particularly limited and may include a configuration in which the light source and the color conversion film are brought in tightly contact with each other may be employed or a remote phosphor form in which the light source and the color conversion film are separated may be employed. In addition, the backlight unit may have a configuration further including a color filter for the purpose of enhancing the color purity. As described above, the excitation light in a range of 400 nm to 500 nm has relatively low excitation energy, and thus decomposition of the compound represented by Formula (1) can be prevented. Consequently, the light source is preferably a light-emitting diode having a maximum light emission peak in a range of 400 nm to 500 nm.

The backlight unit in the present invention can be suitably used for applications such as a displays, lighting, interior, signs, and signboards. In particular, the backlight unit is particularly, preferably used applications for displays and lighting. For example, a liquid crystal display or a lighting device that is one example of the liquid crystal display device according to the present invention includes the backlight unit having at least the light source and the color conversion film as the light emitting device as described above.

EXAMPLES

Hereinafter, the present invention will be described with reference to Examples. The present invention, however, is not limited to these Examples. The numbers of the compounds in the following each Example refer to the numbers of the compounds described above. In addition, evaluation methods for structural analysis will be described below.

<Measurement of $^1$H-NMR>

$^1$H-NMR of the compound was measured with a deuterated chloroform solution using a superconducting FTNMR EX-270 (manufactured by JEOL Ltd.).

<Measurement of Absorption Spectrum>

The absorption spectrum of the compound was measured by dissolving the compound in toluene at a concentration of $1 \times 10^{-6}$ mol/L using Spectrophotometer U-3200 (manufactured by Hitachi, Ltd.).

<Measurement of Fluorescence Spectrum>

As the fluorescence spectrum of the compound, a fluorescence spectrum when the compound was excited at a wavelength of 460 nm was measured by dissolving the compound in toluene at a concentration of $1 \times 10^{-6}$ mol/L using Fluorescence Spectrophotometer F-2500 (manufactured by Hitachi, Ltd.).

<Measurement of Fluorescence Quantum yield>

The fluorescence quantum yield when the compound was excited at a wavelength of 460 nm was measured by dissolving the compound in toluene at a concentration of $1 \times 10^{-6}$ mol/L using Absolute PL Quantum Yield Spectrometer (Quantaurus-QY, manufactured by Hamamatsu Photonics K.K.).

<Test of Light Durability>

A current of 10 mA was made to pass through a light emitting device equipped with each color conversion film and a blue LED element (manufactured by Pro Light Co., Ltd., model number PM2B-3LBE-SD, light emission peak wavelength: 460 nm) to turn on the LED chip and then an initial luminance was measured using Spectroradiometer (CS-1000, manufactured by Konica Minolta, Inc.). The distance between each color conversion film and the blue LED element was set to 3 cm. Thereafter, the light durability was evaluated by irradiating each color conversion film with the light from the blue LED element at room temperature to measure the time until the luminance retention rate according to the following formula reached 98%.

Luminance retention rate (%)=(Luminance after irradiated with light from blue LED/Initial Luminance)×100 (Rounded to first decimal place)

Synthesis Example 1

Hereinafter, a method for synthesizing a compound R-1 in Synthesis Example 1 in the present invention will be described. In the method for synthesizing the compound R-1, a mixed solution of 300 mg of 4-(4-t-butylphenyl)-2-(4-methoxyphenyl)pyrrole, 201 mg of 2-methoxybenzoyl chloride, and 10 ml of toluene was heated at 120° C. for 6 hours. This heated solution was cooled to room temperature and then evaporated. Subsequently, after the resultant residue was washed with 20 ml of ethanol and vacuum dried in vacuo to give 260 mg of 2-(2-methoxybenzoyl)-3-(4-t-butylphenyl)-5-(4-methoxyphenyl)pyrrole.

Subsequently, the mixed solution of 260 mg of 2-(2-methoxybenzoyl)-3-(4-t-butylphenyl)-5-(4-methoxyphenyl) pyrrole, 180 mg of 4-(4-t-butylphenyl)-2-(4-methoxyphenyl)pyrrole, 206 mg of methanesulfonic anhydride, and 10 ml of degassed toluene was heated at 125° C. for 7 hours under nitrogen stream. After this heated solution was cooled to room temperature, 20 ml of water was poured and the resultant mixture was extracted with 30 ml of dichloromethane. The organic layer was washed twice with 20 ml of water, evaporated, and dried in vacuo.

Subsequently, 305 mg of diisopropylethylamine and 670 mg of boron trifluoride diethyl ether complex were added to the mixed solution of the obtained pyrromethene compound and 10 ml of toluene in nitrogen stream and the resultant mixture was stirred at room temperature for 3 hours. Thereafter, 20 ml of water was poured to the mixture and the resultant mixture was extracted with 30 ml of dichloromethane. The organic layer was washed twice with 20 ml of water, dried over magnesium sulfate, and evaporated. The resultant residue was purified by silica gel column chromatography and dried in vacuo to give 0.27 g of a reddish purple powder. The $^1$H-NMR analysis result of the obtained powder was as follows and the reddish purple powder obtained in the above process was confirmed to be the compound R-1.

$^1$H-NMR (CDCl$_3$ (d=ppm)): 1.19 (s, 18H), 3.42 (s, 3H), 3.85 (s, 6H), 5.72 (d, 1H), 6.20 (t, 1H), 6.42-6.97 (m, 16H), 7.89 (d, 4H).

Figure 4:
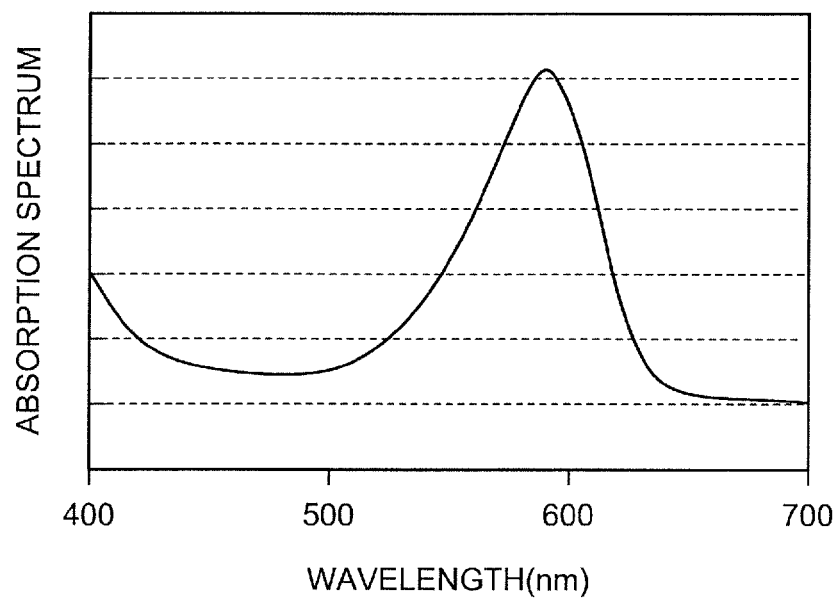
FIG. 4 is a graph illustrating an example of an absorption spectrum of the compound in Synthesis Example 1 in the present invention.
Figure 5:
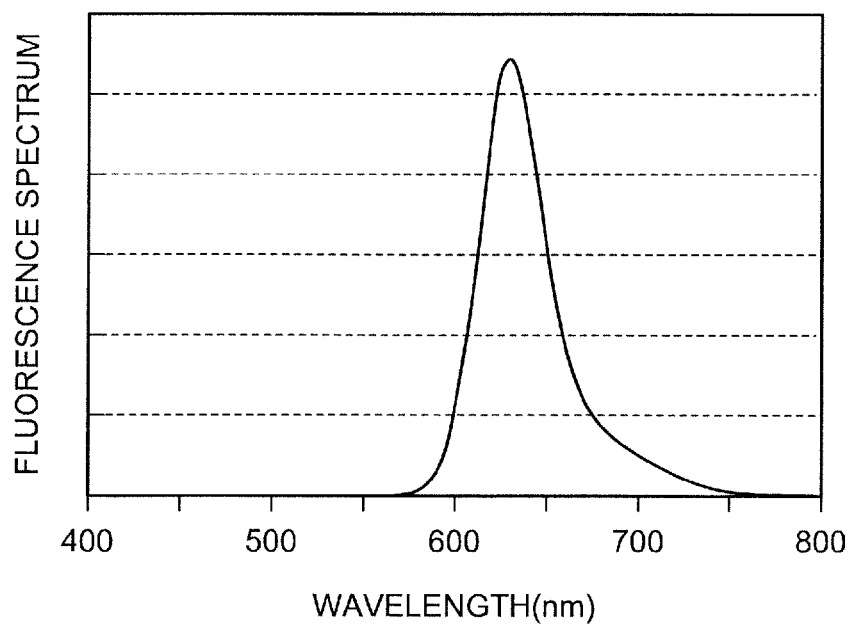
FIG. 5 is a graph illustrating an example of a light emission spectrum of the compound in Synthesis Example 1 in the present invention.

The absorption spectrum of the compound R-1 was as illustrated in FIG. 4 and showed the light absorption characteristics for the blue and green excitation light sources. In addition, the fluorescence spectrum of the compound R-1 was as illustrated in FIG. 5 and showed a sharp light emission peak in the red region. The fluorescence quantum yield was determined to be 90% and thus the compound R-1 was a compound capable of highly efficient color conversion.

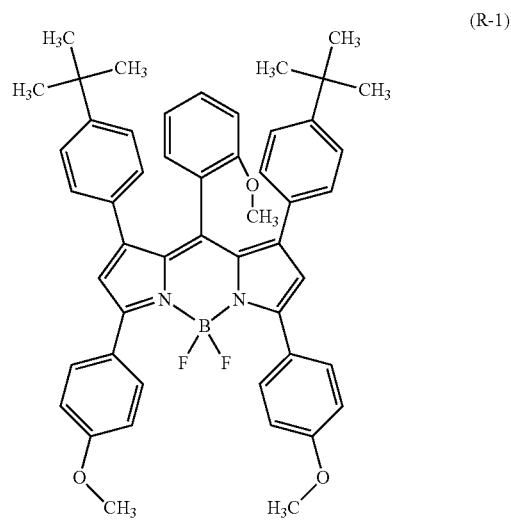

(R-1)

Example 1

In Example 1 of the present invention, 0.08 part by weight of the compound R-1 and 0.5 part by weight of a curing agent were mixed with 100 parts by weight of a two-component thermosetting epoxy-based acrylic resin, and thereafter the resultant mixture was stirred at 300 RPM for 1 hour to prepare a coating composition. Subsequently, this coating composition was applied onto a stretched polyethylene terephthalate film (XG5P1, manufactured by TORAY ADVANCED MATERIALS KOREA Inc.) using a bar coating method and thereafter dried at 120° C. for 5 minutes to form a coating layer having an average film thickness of 10 μm. Thereafter, a diffusion film (Texcell (registered trademark) TDF127, manufactured by TORAY ADVANCED MATERIALS KOREA Inc.) was laminated and aged at 60° C. for 1 hour to give a color conversion film.

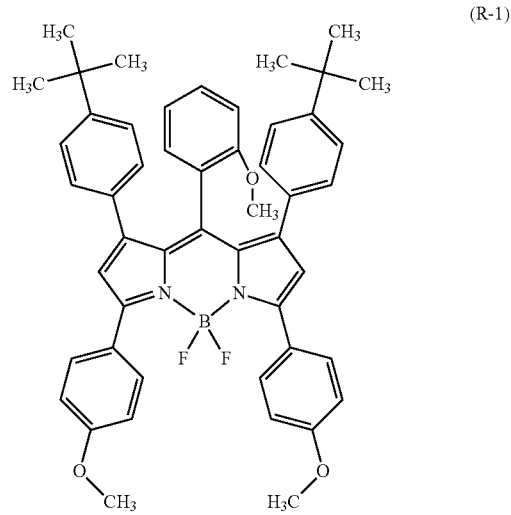

(R-1)

Examples 2 and 3

In Examples 2 and 3 of the present invention, color conversion films were produced in the same manner as Example 1 except that each compound R-2 and compound R-3 was used instead of the compound R-1.

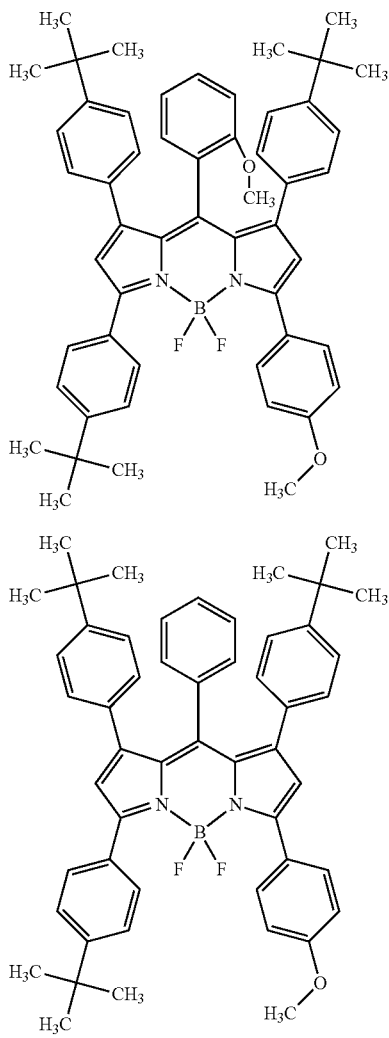

(R-2)

(R-3)

Example 4

In Example 4 of the present invention, a color conversion film was produced in the same manner as Example 1 except that 0.08 part by weight of the compound R-1 and 0.4 part by weight of a compound G-1 were added.

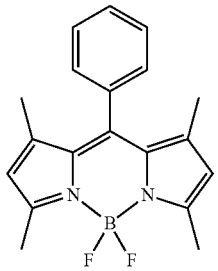

(G-1)

Examples 5 and 6

In Examples 5 and 6 of the present invention, color conversion films were produced in the same manner as Example 4 except that each of the compound R-2 and the compound R-3 was used instead of the compound R-1.

Comparative Example 1

In Comparative Example 1 to the present invention, a color conversion film was produced in the same manner as Example 4 except that a compound R-4 was used instead of the compound R-1.

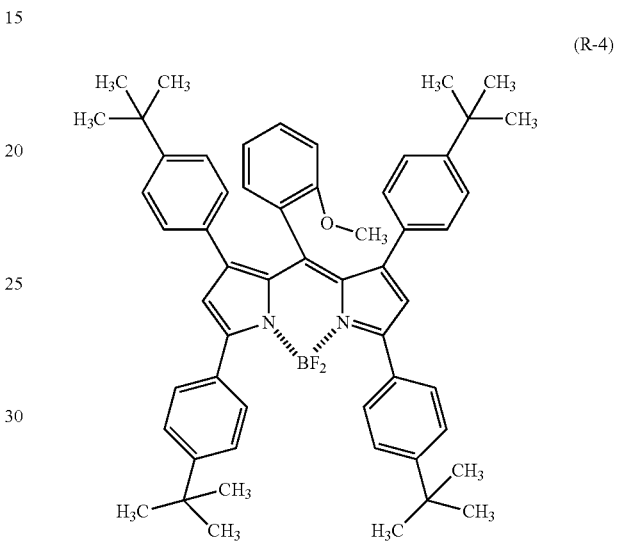

(R-4)

Comparative Example 2

In Comparative Example 2 to the present invention, a color conversion film was produced in the same manner as Example 4 except that a compound R-5 was used instead of the compound R-1.

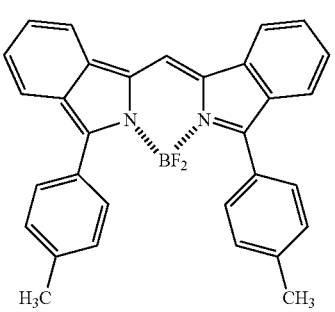

(R-5)

Experimental Example 1

Measurement of Light Emission Spectrum

Each of the color conversion films produced in the above-described Examples 1 to 6, Comparative Example 1, and Comparative Example 2 was placed between a light guide plate and a prism film in a blue LED backlight unit to measure light emission spectra using Illuminance Spectrophotometer (CL-500 A, manufactured by Konica Minolta, Inc.). The measured maximum light emission wavelengths, and the half widths, and the light durability of each color conversion film are listed in Table 1. As can be seen with reference to Table 1, each of the color conversion films of Examples 1 to 6 had higher light durability than the light durability of the color conversion film of either Comparative Example 1 or Comparative Example 2.

TABLE 1

| | Compound | Maximum light emission wavelength (half width) (nm) | Light durability (time to 98% of luminance retention rate) (h) |
|---|---|---|---|
| Example 1 | R-1 | 635 (49) | 100% of luminance retention after 100-hour irradiation |
| Example 2 | R-2 | 629 (50) | 100% of luminance retention after 100-hour irradiation |
| Example 3 | R-3 | 626 (49) | 100% of luminance retention after 100-hour irradiation |
| Example 4 | R-1, G-1 | 630 (46), 527 (35) | 70 |
| Example 5 | R-2, G-1 | 624 (47), 527 (35) | 66 |
| Example 6 | R-3, G-1 | 621 (46), 527 (35) | 68 |
| Comparative Example 1 | R-4, G-1 | 610 (47), 524 (36) | 52 |
| Comparative Example 2 | R-5, G-1 | 680 (38), 529 (50) | 35 |

Experimental Example 2

Evaluation of Luminance and Color reproducibility

Each of the color conversion films produced in the above-described Examples 4 to 6, Comparative Example 1, and Comparative Example 2 was placed between the light guide plate and the prism film in the blue LED backlight unit to measure luminance and color reproducibility using Display Color Analyzer (CA-310, manufactured by Konica Minolta, Inc.). The results are listed in Table 2. As can be seen with reference to Table 2, each of the color conversion films of Examples 4 to 6 had both higher luminance (relative luminance) and color reproducibility than those of the color conversion film of either Comparative Example 1 or Comparative Example,2.

TABLE 2

| | Example 4 | Example 5 | Example 6 | Comparative Example 1 | Comparative Example 2 |
|---|---|---|---|---|---|
| Relative luminance (%) | 100 | 100 | 100 | 95 | 75 |
| Color reproducibility (NTSC %) | 85 | 84 | 83 | 80 | 65 |

INDUSTRIAL APPLICABILITY

As described above, the color conversion composition and the color conversion film according to the present invention, the light-emitting device including the color conversion film, the liquid crystal display device, and the lighting device are useful for both improving color reproducibility and durability at the same time and, in particular, are suitable for a color conversion composition, a color conversion film, and a light emitting device including the color conversion film, a liquid crystal display device, and a lighting device, which can achieve both high color purity of red and high durability at the same time.

REFERENCE SIGNS LIST

1 COLOR CONVERSION FILM
10 SUBSTRATE LAYER
11 COLOR CONVERSION LAYER
12 BARRIER FILM LAYER

The invention claimed is:
1. A color conversion composition that converts incident light into light having a wavelength longer than that of the incident light, the color conversion composition comprising:
a compound represented by Formula (1):

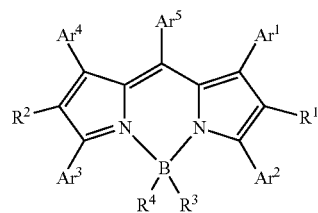

(1)

($R^1$ to $R^4$ are the same or different from each other and selected from the group consisting of hydrogen, an alkyl group, a cycloalkyl group, an aralkyl group, an alkenyl group, a cycloalkenyl group, an alkynyl group, a hydroxy group, a mercapto group, an alkoxy group, an alkylthio group, an aryl ether group, an aryl thioether group, an aryl group, a heteroaryl group, a heterocyclic group, a halogen, a haloalkane, a haloalkene, a haloalkyne, a cyano group, an aldehyde group, a carbonyl group, a carboxy group, an ester group, a carbamoyl group, an amino group, a nitro group, a silyl group, a siloxanyl group, and a ring structure formed between adjacent substituents; $Ar^1$ to $Ar^4$ are the same or different from each other and are groups represented by Formula (2):

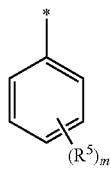

(2)

$R^5$ is selected from the group consisting of an alkyl group, a cycloalkyl group, an alkoxy group, and an alkylthio group; m is an integer of 1 to 3; when m is 2 or more, each $R^5$ is the same as or different from each other; with the proviso that $Ar^1 \neq Ar^2$ or $Ar^3 \neq Ar^4$ and at least one of $Ar^1$ to $Ar^4$ is a group in which $R^5$ is an alkyl group having 4 or more carbon atoms; (here, "≠" refers to groups having different structures); and $Ar^5$ is an aryl group or a heteroaryl group); and a binder resin.

2. The color conversion composition according to claim 1, wherein at least one of $Ar^1$ to $Ar^4$ in the compound represented by Formula (1) is a group represented by Formula (2) in which $R^5$ is an alkoxy group.

3. The color conversion composition according to claim 1, wherein both $R^3$ and $R^4$ in the compound represented by Formula (1) are fluorine.

4. The color conversion composition according to claim 1, wherein the compound represented by Formula (1) has a local maximum light emission in a region of 580 nm to 750 nm.

5. The color conversion composition according to claim 4, further comprising a compound having a local maximum light emission in a region of 500 nm to 580 nm.

6. A color conversion film comprising a layer obtained by curing the color conversion composition according to claim 1.

7. A light emitting device comprising a light source and the color conversion film according to claim 6.

8. The light emitting device according to claim 7, wherein the light source has a maximum light emission peak in a region of 400 nm to 500 nm.

9. The light emitting device according to claim 8, wherein the light source is a light emitting diode.

10. A liquid crystal display device comprising the light emitting device according to claim 7.

11. A lighting device comprising the light emitting device according to claim 7.

* * * * *